(12) United States Patent
Cho et al.

(10) Patent No.: US 12,236,998 B2
(45) Date of Patent: Feb. 25, 2025

(54) SEMICONDUCTOR DEVICE

(71) Applicant: Samsung Electronics Co., Ltd., Suwon-si (KR)

(72) Inventors: Seongjin Cho, Suwon-si (KR); Kyuchang Kang, Suwon-si (KR); Keonwoo Park, Suwon-si (KR); Donghak Shin, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 172 days.

(21) Appl. No.: 18/143,127

(22) Filed: May 4, 2023

(65) Prior Publication Data

US 2024/0087640 A1 Mar. 14, 2024

(30) Foreign Application Priority Data

Sep. 14, 2022 (KR) .................. 10-2022-0115534

(51) Int. Cl.
| | |
|---|---|
| *G11C 11/40* | (2006.01) |
| *G11C 11/408* | (2006.01) |
| *G11C 11/4091* | (2006.01) |
| *H01L 25/065* | (2023.01) |
| *H10B 12/00* | (2023.01) |
| *H10B 80/00* | (2023.01) |

(52) U.S. Cl.
CPC ...... *G11C 11/4085* (2013.01); *G11C 11/4087* (2013.01); *G11C 11/4091* (2013.01); *H01L 25/0655* (2013.01); *H10B 12/482* (2023.02); *H10B 12/488* (2023.02); *H10B 12/50* (2023.02); *H10B 80/00* (2023.02)

(58) Field of Classification Search
None
See application file for complete search history.

(56) References Cited

U.S. PATENT DOCUMENTS

| | | | |
|---|---|---|---|
| 7,180,787 | B2 | 2/2007 | Hosono et al. |
| 9,311,984 | B1 | 4/2016 | Hong et al. |
| 9,653,139 | B1 | 5/2017 | Park |
| 9,858,982 | B1 | 1/2018 | Kim et al. |
| 10,192,608 | B2 | 1/2019 | Morgan |
| 11,062,763 | B2 | 7/2021 | Bedeschi et al. |
| 11,087,821 | B2 | 8/2021 | Son et al. |
| 11,200,943 | B2 | 12/2021 | Lee |

(Continued)

FOREIGN PATENT DOCUMENTS

| | | |
|---|---|---|
| KR | 101096225 B1 | 12/2011 |
| KR | 20160055012 A | 5/2016 |

(Continued)

*Primary Examiner* — Tan T. Nguyen
(74) *Attorney, Agent, or Firm* — Myers Bigel, P.A.

(57) ABSTRACT

A semiconductor device includes a memory cell array that includes a plurality of memory cells electrically connected to a plurality of word lines and a plurality of bit lines, a word line driving circuit that includes a plurality of sub-word line decoders electrically connected to the plurality of word lines, and a control logic configured to determine a selected word line and unselected word lines among the plurality of word lines, and configured to control the word line driving circuit such that at least one of the unselected word lines that is adjacent to the selected word line is floated during at least a portion of a period in which a voltage of the selected word line returns to an initial level.

20 Claims, 16 Drawing Sheets

(56) References Cited

U.S. PATENT DOCUMENTS

| | | | |
|---|---|---|---|
| 2009/0116304 A1 | 5/2009 | Kim et al. | |
| 2015/0117079 A1 | 4/2015 | Yun et al. | |
| 2016/0064056 A1 | 3/2016 | Kim et al. | |
| 2016/0133323 A1 | 5/2016 | Kwon et al. | |
| 2019/0318784 A1* | 10/2019 | Lee | G11C 16/0483 |
| 2021/0027829 A1 | 1/2021 | Kim et al. | |
| 2021/0027835 A1 | 1/2021 | Lee et al. | |
| 2021/0193213 A1 | 6/2021 | Jeong et al. | |
| 2022/0165325 A1 | 5/2022 | Yoon et al. | |
| 2022/0310169 A1* | 9/2022 | Liang | G11C 16/0483 |

FOREIGN PATENT DOCUMENTS

| | | |
|---|---|---|
| KR | 20210013435 A | 2/2021 |
| KR | 20210079436 A | 6/2021 |

* cited by examiner

SEMICONDUCTOR DEVICE

CROSS-REFERENCE TO RELATED APPLICATION(S)

This application claims benefit of priority to Korean Patent Application No. 10-2022-0115534 filed on Sep. 14, 2022 in the Korean Intellectual Property Office, the disclosure of which is incorporated herein by reference in its entirety.

BACKGROUND

The present disclosure relates to a semiconductor device.

A semiconductor device may be a device capable of storing data and reading stored data and may include a memory cell array in which memory cells storing data are located, and a peripheral circuit connected to the memory cells to write or read data. The memory cells may be connected to a peripheral circuit through word lines and bit lines, and the peripheral circuit may activate a selected word line among the word lines to execute a program operation, a read operation, and the like on the memory cells connected to the selected word line. As a degree of integration of the semiconductor device increases, a distance between word lines may tend to decrease, and memory cells connected to peripheral unselected word lines may be affected in an operation of activating the selected word line.

SUMMARY

Aspects of the present disclosure provide a semiconductor device having improved reliability by minimizing data loss of memory cells connected to unselected word lines rather than a selected word line.

According to aspects of the present disclosure, there is provided a semiconductor device including a memory cell array that includes a plurality of memory cells electrically connected to a plurality of word lines and a plurality of bit lines, a word line driving circuit that includes a plurality of sub-word line decoders electrically connected to the plurality of word lines, and a control logic configured to determine a selected word line and unselected word lines among the plurality of word lines, and configured to control the word line driving circuit such that at least one of the unselected word lines that is adjacent to the selected word line is floated during at least a portion of a period in which a voltage of the selected word line returns to an initial level.

According to aspects of the present disclosure, there is provided a semiconductor device including a memory cell array that includes a plurality of memory cells electrically connected to a plurality of word lines and a plurality of bit lines, a word line driving circuit that includes a plurality of sub-word line decoders electrically connected to the plurality of word lines, and a control logic configured to determine a selected word line and unselected word lines among the plurality of word lines. Each of the plurality of sub-word line decoders may include a plurality of switch elements electrically connected to a respective one of the plurality of word lines, and a floating element electrically connected between a reference node supplying a voltage at an initial level and at least a portion of the plurality of switch elements. During at least a portion of a precharging period in which a voltage of the selected word line decreases from an active level to the initial level, the control logic may be configured to input a floating control signal having a voltage that turns off the floating element into the floating element.

According to aspects of the present disclosure, there is provided a semiconductor device including a memory cell array that includes a plurality of memory cells electrically connected to a plurality of word lines and a plurality of bit lines, and a peripheral circuit configured to control the memory cell array. The peripheral circuit may be configured to perform a control operation for a selected memory cell among the plurality of memory cells through a selected bit line among the plurality of bit lines while a voltage of a selected word line among the plurality of word lines is maintained at an active level, and set a voltage of at least one unselected word line, adjacent to the selected word line, among the plurality of word lines to a level lower than an initial level during at least a portion of a period in which the voltage of the selected word line decreases from the active level to the initial level.

According to example embodiments of the present disclosure, a control operation may be performed on a selected memory cell by activating a selected word line, and at least one unselected word line, adjacent to the selected word line, may be caused to float while a voltage of the selected word line is reduced from an active level to an initial level. Accordingly, a voltage of the unselected word line may decrease to a level lower than the initial level, and then may return to the initial level, and data loss of unselected memory cells connected to the unselected word line may be minimized, thereby improving reliability of a semiconductor device.

The various and beneficial advantages and effects of the present disclosure are not limited to the above description, and will be more easily understood in the course of describing specific example embodiments of the present disclosure.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present disclosure will be described with reference to the accompanying drawings.

Figure 1:
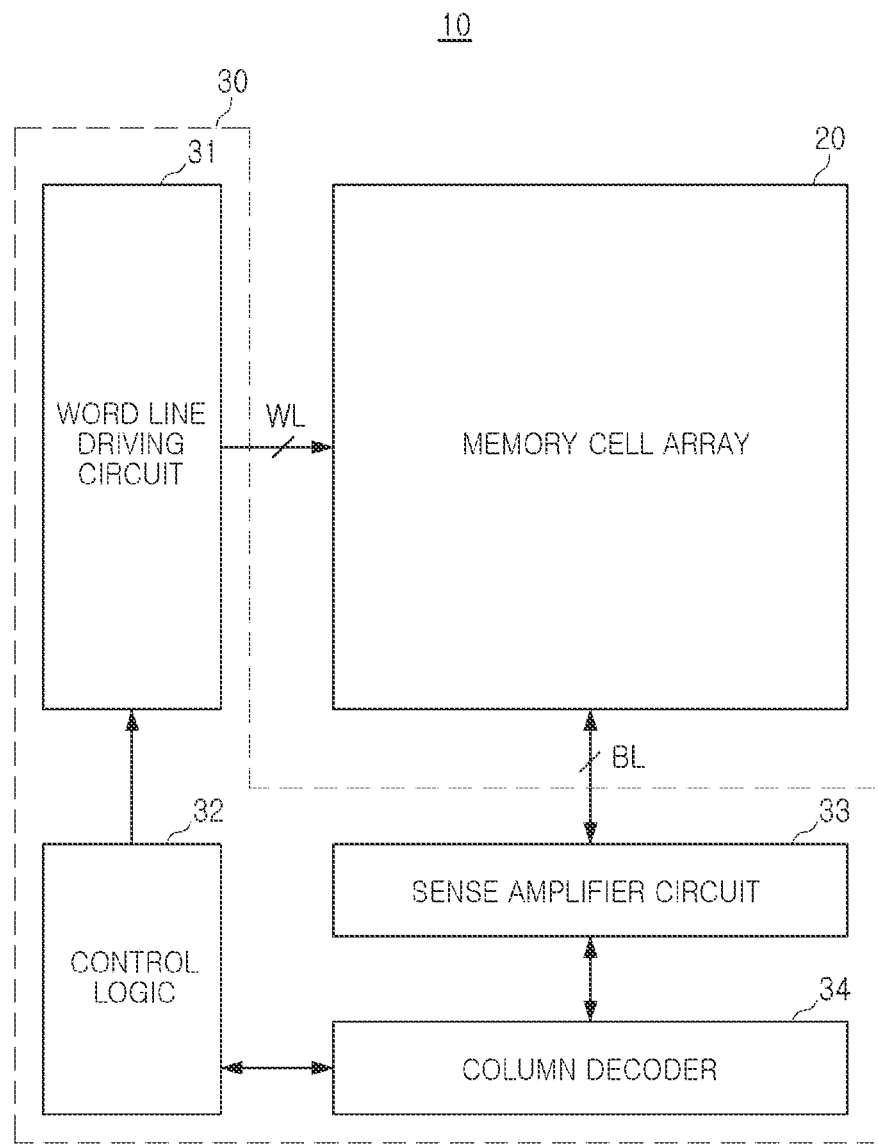
FIG. 1 is a schematic block diagram illustrating a semiconductor device according to example embodiments of the present disclosure.

FIG. 1 is a schematic block diagram illustrating a semiconductor device according to example embodiments of the present disclosure.

Referring to FIG. 1, a semiconductor device 10 may be a storage device based on a semiconductor element. The semiconductor device 10 may be a random access memory (RAM) device such as dynamic random access memory (DRAM), synchronous DRAM (SDRAM), static RAM (SRAM), double date rate SDRAM (DDR SDRAM), DDR2 SDRAM, DDR3 SDRAM, phase-change RAM (PRAM), magnetic RAM (MRAM), resistive RAM (RRAM), or the like. The semiconductor device 10 may store data received through a data signal DQ (not shown) or output data through the data signal DQ, in response to an address signal ADDR (not shown) and a control command signal CMD (not shown) received from an external host (for example, a central processing unit (CPU), an application processor (AP), or a system on a chip (SoC). The semiconductor device 10 may include a memory cell array 20 and a peripheral circuit 30, and the peripheral circuit 30 may include a word line driving circuit 31, a control logic 32, a sense amplifier circuit 33, a column decoder 34, and the like.

The memory cell array 20 may include a plurality of memory cells, and the plurality of memory cells may be connected to the word line driving circuit 31 through a plurality of word lines WL, and may be connected to the sense amplifier circuit 33 through a plurality of bit lines BL. As used herein, when two or more elements having electrical functionality are described as being connected, it may refer to the two or more elements being electrically connected, unless the context indicates otherwise. Each of the plurality of memory cells may be positioned at a respective point at which the plurality of word lines WL and the plurality of bit lines BL intersect. The plurality of memory cells may be arranged in a matrix form in the memory cell array 20, and each of the plurality of memory cells may include at least one memory element for storing data. For example, when the semiconductor device 10 is a DRAM, each of the plurality of memory cells may include a switch element and a cell capacitor.

The control logic 32 may receive an address signal and a control command signal from the external host. The address signal may include a row address indicating a row in the memory cell array 20 and a column address indicating a column in the memory cell array 20. For example, the word line driving circuit 31 may select at least one of the plurality of word lines WL with reference to the row address, and the column decoder 34 may select at least one of the plurality of bit lines BL with reference to the column address.

The sense amplifier circuit 33 may include a plurality of bit line sense amplifiers connected to the memory cell array 20 through the plurality of bit lines BL. Among the plurality of bit line sense amplifiers, a bit line sense amplifier connected to a selected bit line among the plurality of bit lines BL selected by the column decoder 34 may read data of at least one selected memory cell among memory cells connected to the selected bit line, or may store data in the selected memory cell.

The selected memory cell may be a memory cell connected to a selected word line selected from among the plurality of word lines WL by the word line driving circuit 31. As a degree of integration of the semiconductor device 10 gradually increases, a distance between the plurality of word lines WL may also tend to gradually decrease. Accordingly, while the word line driving circuit 31 drives the selected word line, adjacent unselected word lines may be affected. For example, as the word line driving circuit 31 changes a voltage level of the selected word line, parasitic capacitance existing between the selected word line and the unselected word line is charged and/or discharged, such that data of unselected memory cells connected to the unselected word line may be changed.

In example embodiments of the present disclosure, during at least a portion of a period in which the word line driving circuit 31 controls a voltage of the selected word line, at least one unselected word line, adjacent to the selected word line, among unselected word lines may be caused to float (i.e., may be floated). For example, the at least one unselected word line may be floated when it is not maintained at a reference voltage (described in further detail later with reference to, for example, FIGS. 5 to 16). Accordingly, a voltage of the unselected word line may be reduced to a level lower than an initial level while the voltage of the selected word line decreases to the initial level, thereby reducing stress of the unselected word line, and preventing data loss of the unselected memory cells connected to the unselected word line.

Figure 2:
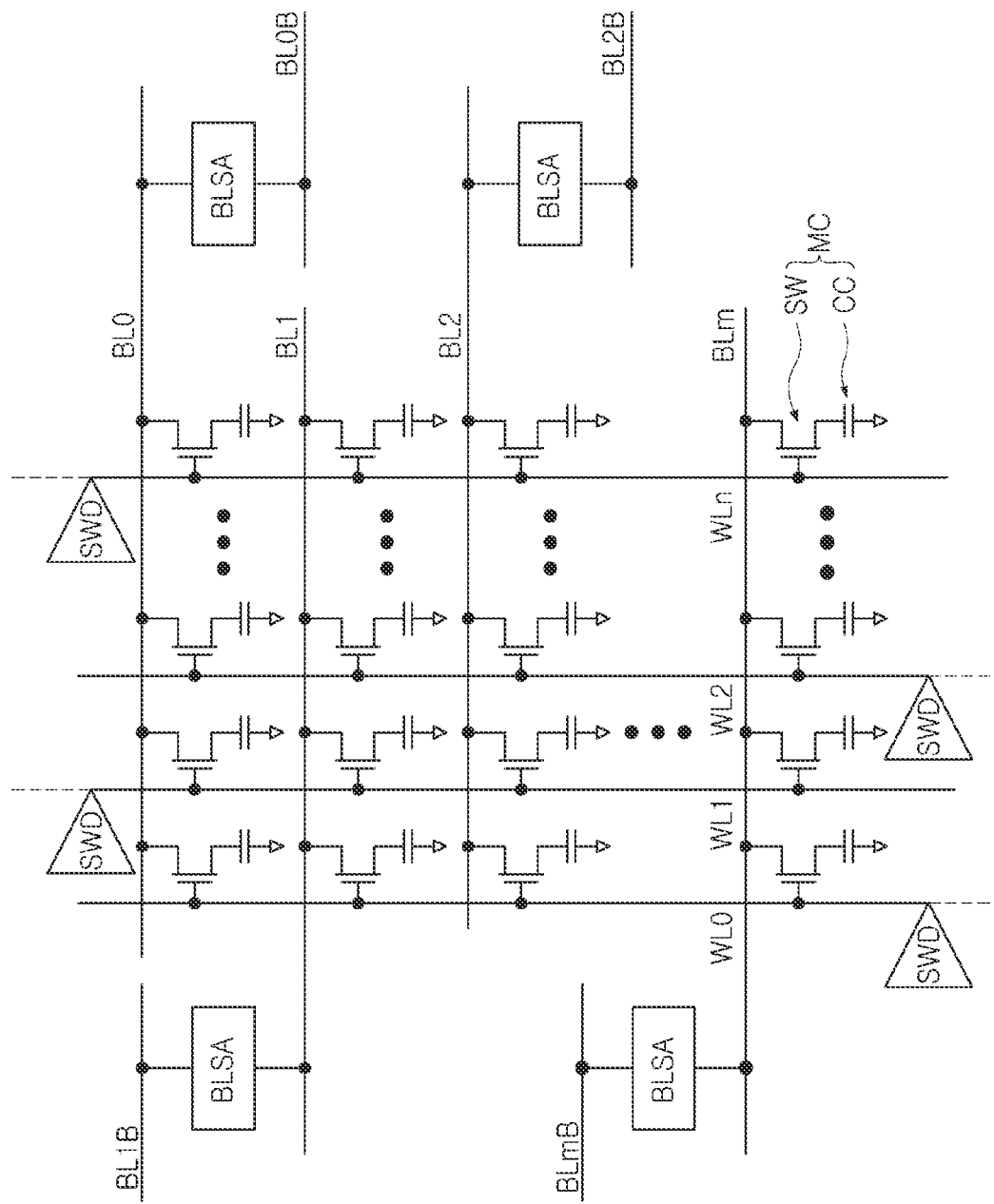
FIG. 2 is a schematic diagram illustrating a structure of a semiconductor device according to example embodiments of the present disclosure.

FIG. 2 is a schematic diagram illustrating a structure of a semiconductor device according to example embodiments of the present disclosure.

Referring to FIG. 2, each of a plurality of memory cells MC included in a memory cell array may include a cell capacitor CC and a cell switch SW. A control terminal of the cell switch SW may be connected to word lines WL0 to WLn, and an input terminal of the cell switch SW may be connected to bit lines BL0 to BLm or complementary bit lines BL0B to BLmB. For example, the control terminal of the cell switch SW may be a gate terminal and the input terminal of the cell switch SW may be a source/drain terminal, but the present disclosure is not limited thereto. The word lines WL0 to WLn may be connected to sub-word line decoders SWD, and the bit lines BL0 to BLm and the complementary bit lines BL0B to BLmB may be connected to bit line sense amplifiers BLSA. For example, the bit line sense amplifiers BLSA may be included in the sense amplifier circuit 33 of FIG. 1.

A control logic may decode a row address externally received to determine a selected word line from among the plurality of word lines WL0 to WLn. The control logic may output a word line enable signal for activating the selected word line to the sub-word line decoders SWD. In addition, the control logic may decode the row address to generate driving signals for activating the selected word line, and may provide the driving signals to the sub-word line decoders SWD. For example, the control logic may be realized by using a hardware method, a software method, or a combination thereof.

The sub-word line decoders SWD may determine the selected word line in response to a word line enable signal and driving signals, and may increase a voltage level of the selected word line from an initial level to an active level. Accordingly, the cell switch SW included in each of the memory cells MC connected to the selected word line may be turned on. While a voltage of the selected word line is maintained at the active level, the bit line sense amplifier BLSA connected to a selected memory cell may read data from the selected memory cell through a selected bit line or write data to the selected memory cell.

When a control operation performed on the selected memory cell is completed, the voltage level of the selected word line may decrease back to the initial level from the active level. As described, while the voltage of the selected word line increases and decreases, data of unselected memory cells connected to an unselected word line disposed to be adjacent to the selected word line may be unintentionally changed.

In example embodiments of the present disclosure, in order to resolve the above-described issue, during a pre-charging period in which the voltage of the selected word line returns to the initial level, the unselected word line, adjacent to the selected word line, may be caused to float (i.e., may be floated) instead of being maintained at the initial level. For example, a time point at which the unselected word line floats may be before or after the voltage of the selected word line starts to decrease to the initial level. Accordingly, while the voltage of the selected word line decreases to the initial level, the voltage of the unselected word line may decrease to a level lower than the initial level, and data loss of unselected memory cells connected to the unselected word line may be prevented.

Each of the sub-word line decoders SWD may include a floating element not directly connected to one of the plurality of word lines WL0 to WLn so as to cause at least one of the unselected word lines to float, as necessary. For example, the floating element may be connected between a switch element directly connected to one of the plurality of word lines WL0 to WLn and a reference node supplying an initial level of voltage. For example, the reference node may supply a voltage at an initial level. In addition, the control logic may provide, to each of the sub-word line decoders SWD, a floating control signal for controlling whether each of the plurality of word lines WL0 to WLn floats by turning on/off the floating element.

Figure 3:
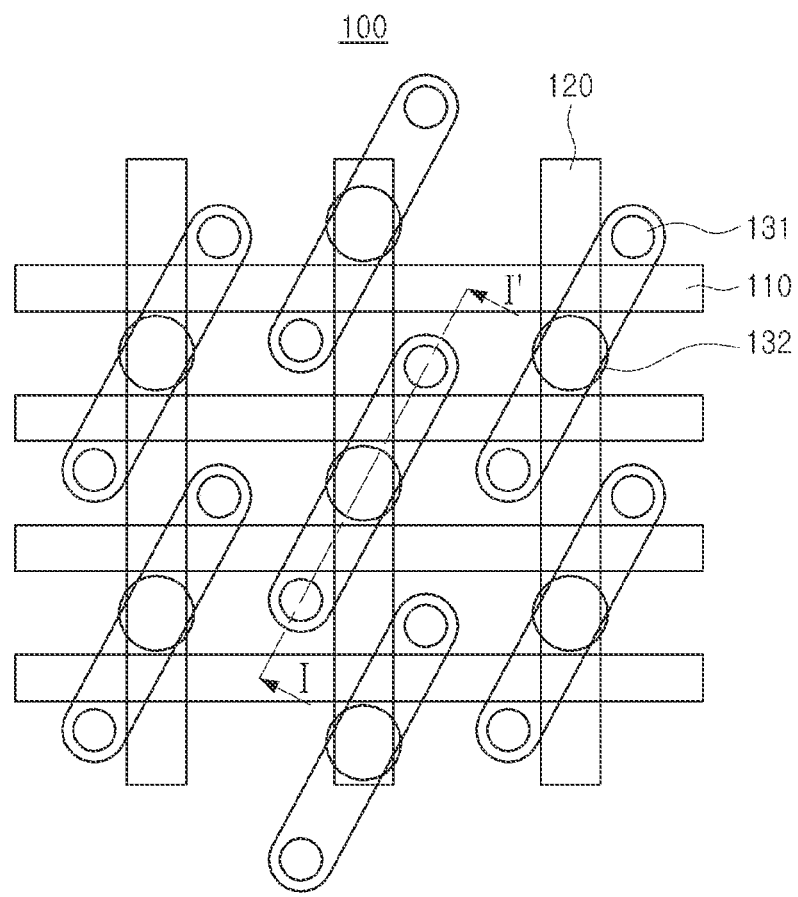
FIGS. 3 and 4 are schematic diagrams illustrating a structure of a portion of a memory cell array included in a semiconductor device according to example embodiments of the present disclosure.
Figure 4:
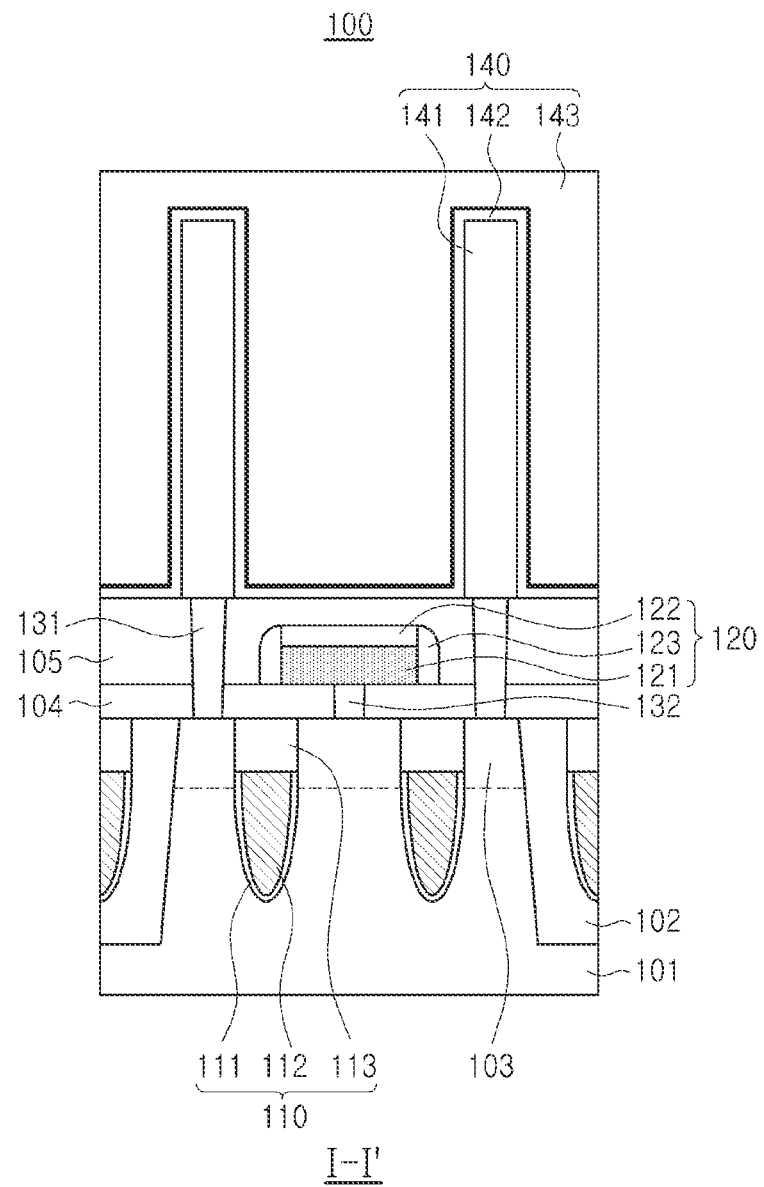

FIGS. 3 and 4 are schematic diagrams illustrating a structure of a portion of a memory cell array included in a semiconductor device according to example embodiments of the present disclosure. More specifically, FIG. 3 is a schematic plan view illustrating a structure of a portion of a memory cell array included in a semiconductor device according to example embodiments of the present disclosure, and FIG. 4 is a schematic cross-sectional view taken along line I-I' of FIG. 3.

Referring to FIGS. 3 and 4, a semiconductor memory device 100 according to example embodiments of the present disclosure may include a substrate 101, and the substrate 101 may include an element isolation film 102, and an active region 103 isolated by the element isolation film 102. In addition, a plurality of gate structures 110 providing a plurality of word lines may be buried in or may extend in the substrate 101. The plurality of bit lines may be provided by a plurality of bit line structures 120 extending in a direction, intersecting the plurality of gate structures 110, and connected to at least a portion of the active region 103.

Each of the plurality of gate structures 110 may include a gate insulating layer 111, a gate electrode layer 112, a capping layer 113, and the like. The gate insulating layer 111 may be formed of silicon oxide, and the gate electrode layer 112 may be formed of a conductive material such as a metal, a metal compound, polysilicon, or the like. The capping layer 113 may be formed of an insulating material such as silicon nitride.

The active region 103 may be doped with impurities and may provide a source region and a drain region of a cell switch included in a memory cell. The portion of the active region 103 positioned between the gate structure 110 and the element isolation film 102 may be connected to a capacitor structure 140 through a first contact 131. The portion of the active region 103 disposed between a pair of gate structures 110 adjacent to each other may be connected to one of the bit line structures 120 through a second contact 132.

The plurality of bit line structures 120 along with the first contact 131 and the second contact 132 may be buried in or extend in one or more of intermediate insulating layers 104 and 105. The intermediate insulating layers 104 and 105 may include a first intermediate insulating layer 104 and a second intermediate insulating layer 105. Each of the plurality of bit line structures 120 may include a bit line conductive layer 121, a bit line capping layer 122, a spacer layer 123, and the like.

The capacitor structure 140 may be connected to the active region 103 through the first contact 131, and may include a lower electrode layer 141, a dielectric layer 142, an upper electrode layer 143, and the like. The capacitor structure 140 may extend in a direction, perpendicular to an upper surface of the substrate 101. As illustrated in FIG. 4, the lower electrode layer 141 may have a column shape or a cylinder shape having an empty central portion.

Referring to FIG. 4, as a left gate structure 110 is repeatedly selected (e.g., repeatedly activated by a selected word line) from among a pair of gate structures 110 adjacent to each other, an amount of charge of the capacitor structure 140 connected to a right gate structure 110 may be unintentionally changed. For example, when the left gate structure 110 is repeatedly selected such that a voltage thereof transitions between an active level and an initial level several times, accumulation and discharge of charges may be repeated in a channel region (e.g., a channel region of the active region 103). In this case, charges of the capacitor structure 140 included in a memory cell provided by the right gate structure 110 may be lost, or data may be changed due to additional charges.

For example, when a voltage level of the right gate structure 110 is maintained at the initial level while the left gate structure 110 is repeatedly selected, some of the charges discharged from the channel region, adjacent to the left gate structure 110, may flow into the capacitor structure 140 of a memory cell provided by the right gate structure 110.

In example embodiments of the present disclosure, during at least a portion of a time period in which one of the plurality of gate structures 110 is selected, another gate structure 110 adjacent thereto may be caused to float (i.e., may be floated) to prevent the above-described issue. For example, the right gate structure 110 may be caused to float in at least a portion of a period in which a voltage of the left gate structure 110 decreases from the active level to the initial level. In this case, a voltage of the right gate structure 110 may decrease to a level lower than the initial level such that the voltage of the right gate structure 110 is under the influence (e.g., low enough to avoid or reduce the influence) of a decrease in a voltage level of the left gate structure 110, thereby minimizing the flow of charges discharged from the channel region of the left gate structure 110 into the capacitor structure 140 of the memory cell provided by the right gate structure 110. Accordingly, when a specific word line is repeatedly selected, a row hammer phenomenon in which data of unselected memory cells connected to another adjacent word line is affected may be effectively prevented.

Figure 5:
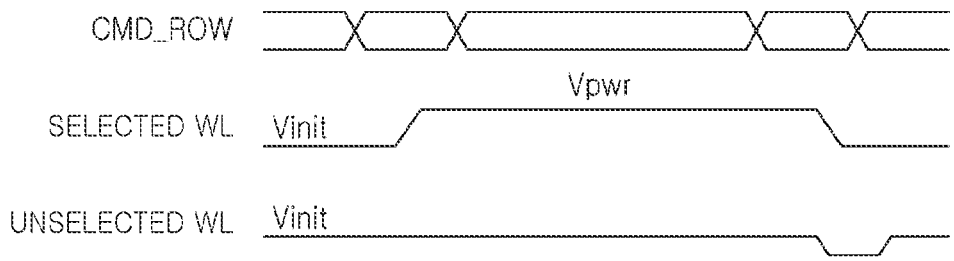
FIG. 5 is a diagram illustrating an operation of a semiconductor device according to example embodiments of the present disclosure.

FIG. 5 is a diagram illustrating an operation of a semiconductor device according to example embodiments of the present disclosure.

Referring to FIG. 5, a semiconductor device according to example embodiments of the present disclosure may receive a row command signal CMD_ROW from an external host such as a central processing unit, an application processor, or the like. A control logic of the semiconductor device may determine selected word lines and unselected word lines from among a plurality of word lines with reference to the row command signal CMD_ROW and an address signal received together with the row command signal CMD-_ROW.

The control logic may increase a voltage level of a selected word line in response to an activation command ACT (not shown) of the row command signal CMD_ROW. For example, the control logic may increase a voltage of the selected word line from an initial level Vinit to an active level Vpwr by controlling a sub-word line decoder connected to the selected word line in a word line driving circuit. Conversely, voltage levels of unselected word lines may be maintained as the initial level Vinit.

The control logic may perform a control operation for a selected memory cell connected to the selected word line using bit line sense amplifiers while the voltage of the selected word line is maintained at the active level Vpwr. For example, the control operation may include a program operation, a read operation, a refresh operation, and the like. When the control operation is terminated, a control logic circuit may control the sub-word line decoder connected to the selected word line to restore the voltage of the selected word line from the active level Vpwr to the initial level Vinit.

In example embodiments of the present disclosure, at least one unselected word line, adjacent to the selected word line, among unselected word lines may be caused to float (i.e., may be floated) while the voltage of the selected word line returns to the initial level Vinit. A voltage of the floating unselected word line may decrease to a level lower than the initial level Vinit as illustrated in FIG. 5, in response to a decrease in the voltage of the adjacent selected word line. Accordingly, in a memory cell including a gate structure providing an unselected word line, a cell switch may be turned off, and charges flowing into a cell capacitor may be effectively blocked, thereby minimizing data loss of an unselected memory cell.

Figure 6:
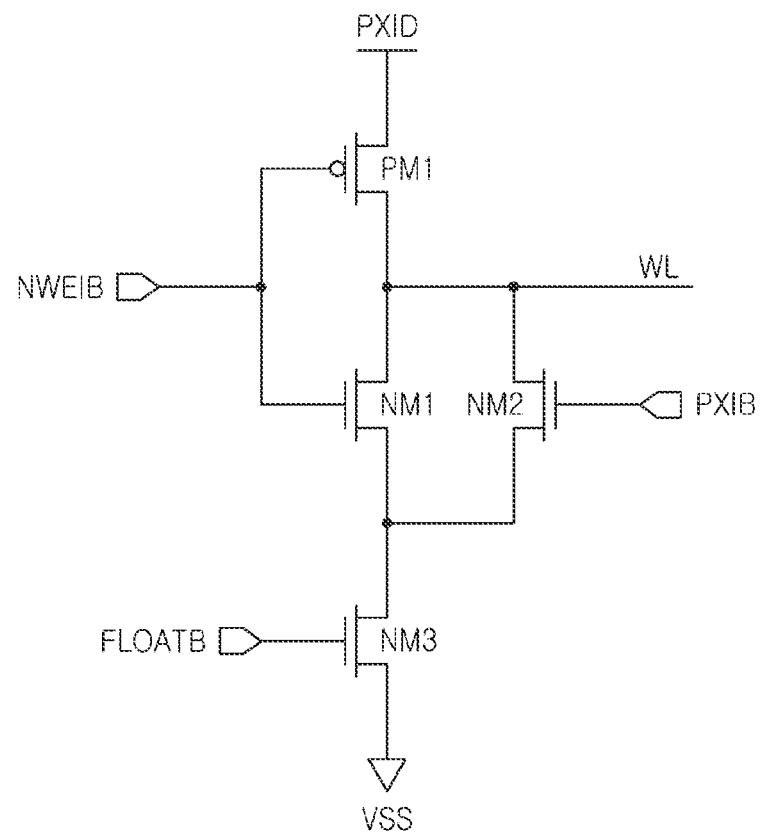
FIGS. 6 and 7 are schematic diagrams illustrating a sub-word line decoder included in a semiconductor device according to example embodiments of the present disclosure.
Figure 7:
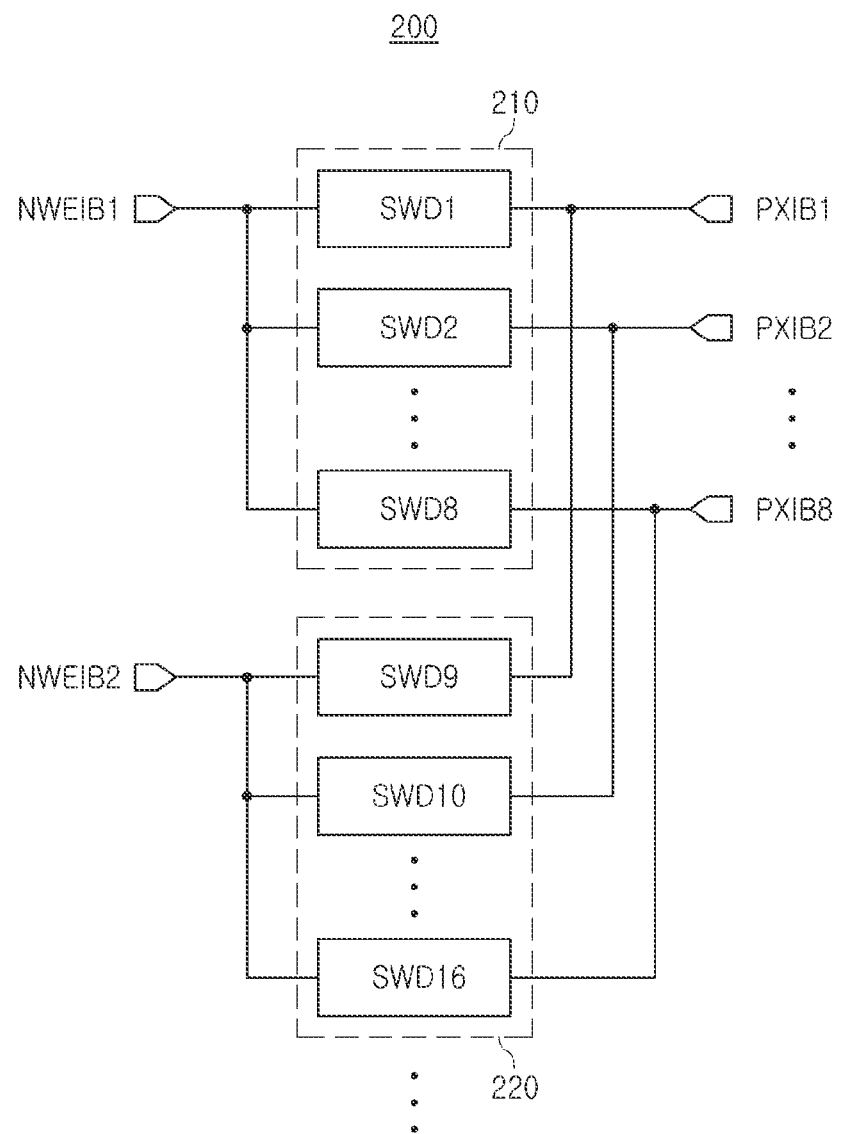

FIGS. 6 and 7 are schematic diagrams illustrating a sub-word line decoder included in a semiconductor device according to example embodiments of the present disclosure.

FIG. 6 is a circuit diagram illustrating a sub-word line decoder included in a memory device according to example embodiments of the present disclosure. Referring to FIG. 6, the sub-word line decoder may include a plurality of switch elements PM1, NM1, and NM2 and at least one floating element NM3. For example, the plurality of switch elements PM1, NM1, and NM2 may be connected to each other in series, and may include a first switch element PM1 being turned on and off by a word line control signal NWEIB, a second switch element NW, and a third switch element NM2. For example, the first switch element PM1 may be connected in series with the second and third switch elements NM1 and NM2, and the second and third switch elements NM1 and NM2 may be connected with each other in parallel. As illustrated in FIG. 6, the second switch element NM1 and the third switch element NM2 may be connected to each other in parallel. For example, an element may be turned on (or similar language) when a current can flow freely therethrough. For example, an element may be turned off (or similar language) when little to no current can flow therethrough (e.g., a leakage current may still exist). When an element is turned off, it may still be considered to be electrically connected to another element or between other elements, but little to no current may flow through the element.

The first switch element PM1 may be a PMOS transistor, and the second switch element NM1 may be an NMOS transistor. In example embodiments, a first driving signal PXID may be input into the first switch element PM1, and the second switch element NM1 may be connected to the floating element NM3. The first driving signal PXID may have different levels depending on whether a word line WL connected to the sub-word line decoder is a selected word line. For example, a node that has the first driving signal PXID may be a driving node, and a voltage at the driving node may be a voltage of the first driving signal PXID. For example, the driving node may supply the first driving signal PXID. The first switch element PM1 may be connected between the driving node and a word line WL connected to the sub-word line decoder.

The third switch element NM2 may be turned on and off by a second driving signal PXIB. In the same manner as the second switch element NW, the third switch element NM2 may be connected to a reference node supplying a reference voltage VSS through the floating element NM3. For example, the reference node may supply a voltage at an initial level. In other words, a voltage at the reference node may be a reference voltage VSS. Accordingly, when the floating element NM3 is turned on, the reference voltage VSS may be input into the second switch element NM1 and the third switch element NM2.

The floating element NM3 may be turned on and off by a floating control signal FLOATB. When the second switch element NM1 and the third switch element NM2 are turned on and the floating element NM3 is also turned on, the reference voltage VSS corresponding to an initial level may be input into the word line WL. Conversely, when the second switch element NM1 and the third switch element NM2 are turned on and the floating element NM3 is turned off, the word line WL may float.

As described above, a control logic of a semiconductor device may control the plurality of switch elements PM1, NW, and NM2 and the floating element NM3 to adjust a voltage level of the word line WL or to cause the word line WL to float. For example, when the word line WL is a selected word line, the control logic may turn on the first switch element PM1 and turn off the second switch element NM1 and the third switch element NM2. In addition, a voltage of the word line WL may be increased to an active level by increasing a level of the first driving signal PXID.

Conversely, when the word line WL is an unselected word line, the control logic may turn off the first switch element PM1 and turn on the second switch element NM1 and the third switch element NM2. In addition, the control logic may also turn on the floating element NM3 to input the reference voltage VSS corresponding to the initial level into the word line WL.

When the word line WL is an unselected word line, not adjacent to the selected word line, the control logic may connect the word line WL to the reference node until a control operation performed on the selected memory cell is completed and a voltage of the selected word line returns to the initial level. Accordingly, the voltage of the word line WL may be continuously maintained as the reference voltage VSS. For example, the control logic may be configured to set respective voltages of unselected word lines, not adjacent to the selected word line, to the initial level.

When the word line WL is an unselected word line, adjacent to the selected word line, the control logic may turn on the second switch element NM1 and the third switch element NM2 and turn off the first switch element PM1 and the floating element NM3 in at least a portion of a period in which the voltage of the selected word line returns to the initial level. Accordingly, the word line WL may float. The floating word line WL may decrease to a voltage at a level lower than the reference voltage VSS such that the voltage of the floating word line WL is under the influence (e.g., low enough to avoid or reduce the influence) of a precharging operation in which the voltage of the adjacent selected word line returns to the initial level, thereby effectively preventing data loss of unselected memory cells connected to the word line WL.

FIG. 7 is a diagram illustrating a connection relationship between sub-word line decoders SWD1 to SWD16 and control signals. Referring to FIG. 7, among the plurality of sub-word line decoders SWD1 to SWD16 included in a word line driving circuit 200, some sub-word line decoders adjacent to each other may be grouped into decoder groups 210 and 220. In the example embodiment illustrated in FIG. 7, each of the decoder groups 210 and 220 may include eight of the plurality of sub-word line decoders SWD1 to SWD16.

A first word line control signal NWEIB1 may be input in common into first to eighth sub-word line decoders SWD1 to SWD8 of a first decoder group 210, and a second word line control signal NWEIB2 may be input in common into ninth to sixteenth sub-word line decoders SWD9 to SWD16 of a second decoder group 220.

One of first to eighth driving signals PXIB1 to PXIB8 may be input in common into an i-th (i is a natural number from 1 to 8) sub-word line decoder of the first decoder group 210 and an i-th sub-word line decoder of the second decoder group 220. For example, the ninth sub-word line decoder SWD9 may be considered a first sub-word line decoder SWD9 of the second decoder group 220, the tenth sub-word line decoder SWD10 may be considered a second sub-word line decoder SWD10 of the second decoder group 220, and the eleventh to sixteenth sub-word line decoders SWD11 to SWD16 may be considered in the same manner. As described above with reference to FIG. 6, each of the first to eighth driving signals PXIB1 to PXIB8 may be a signal input into a first switch element included in each of the sub-word line decoders SWD1 to SWD16.

When the plurality of sub-word line decoders SWD1 to SWD16 are implemented as illustrated in FIG. 7 in the word line driving circuit 200, the control logic can control the plurality of sub-word line decoders SWD1 to SWD16 depending on whether a sub-word line decoder connected to an unselected word line, adjacent to the selected word line, and a sub-word line decoder connected to the selected word line are commonly included in one of the decoder groups 210 and 220. Hereinafter, an operation according to a connection relationship between each of the selected word line and the unselected word line and the sub-word line decoders SWD1 to SWD16 will be described.

Figure 8:
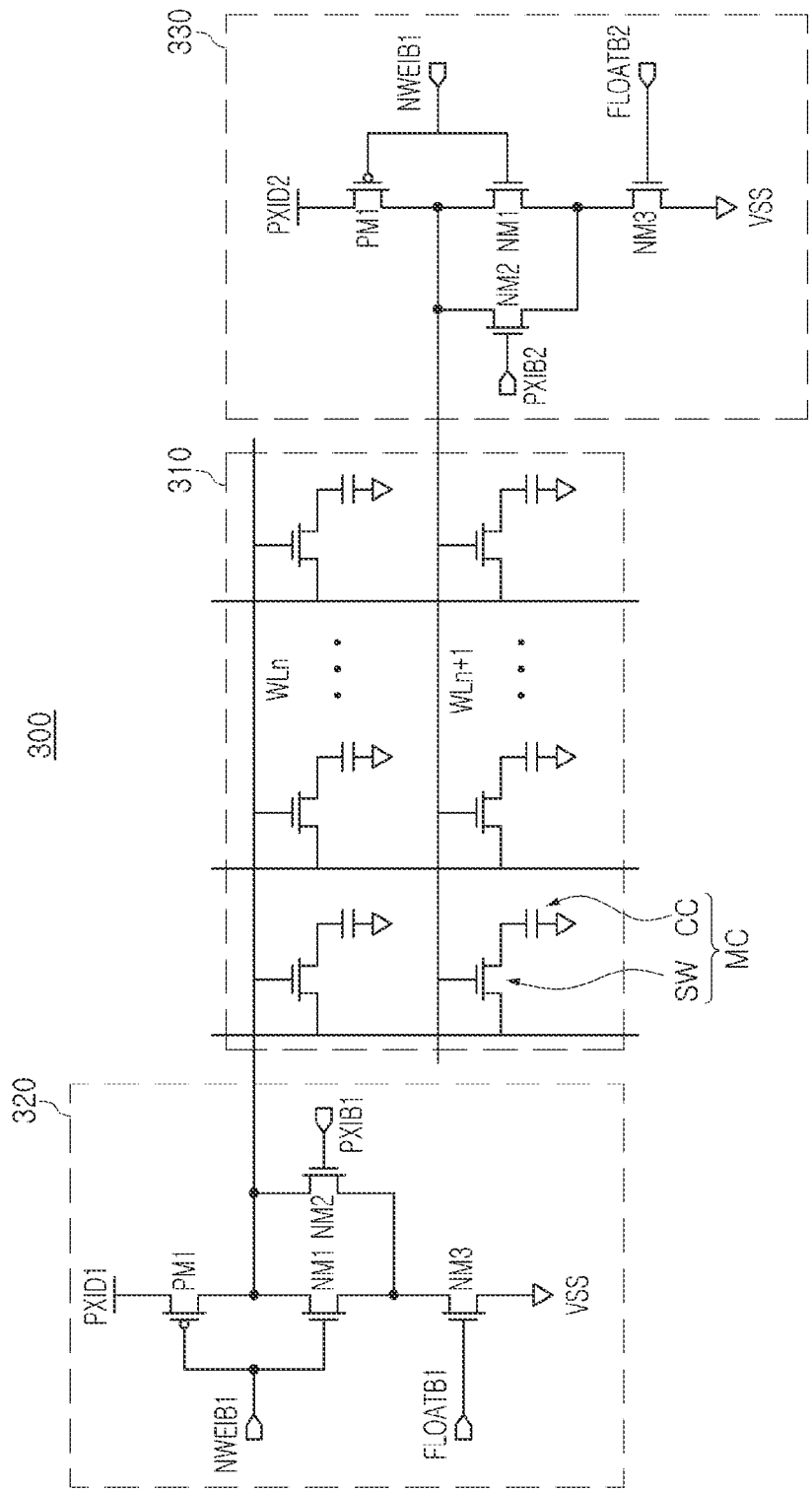
FIG. 8 is a schematic diagram illustrating a semiconductor device according to example embodiments of the present disclosure.
Figure 9:
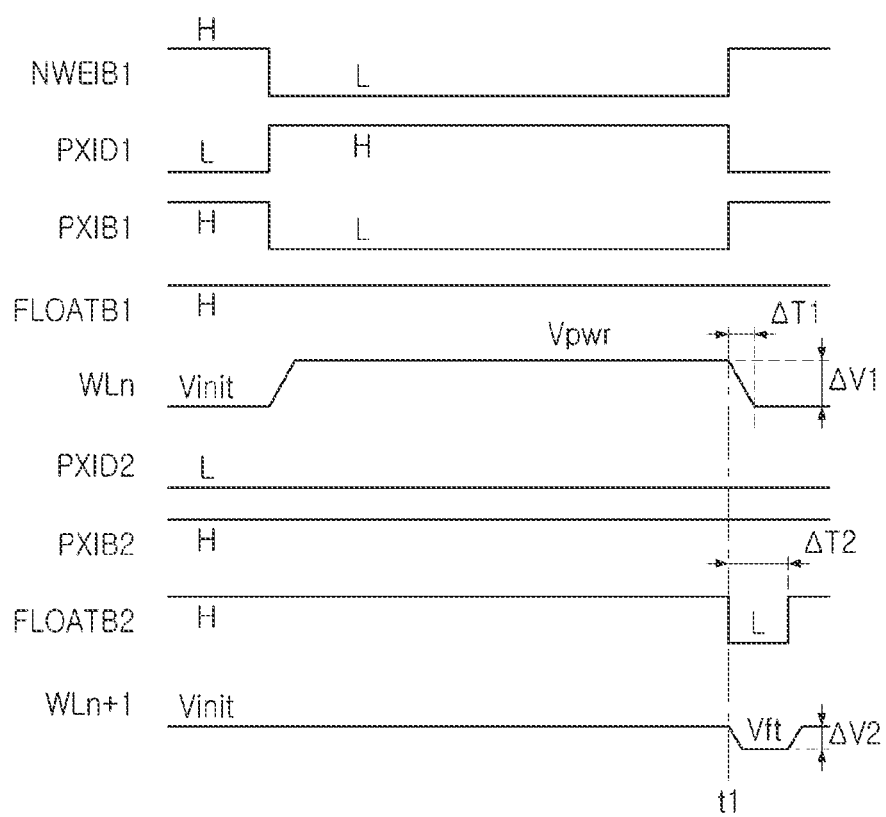
FIG. 9 is a diagram illustrating an operation of a semiconductor device according to example embodiments of the present disclosure.

FIG. 8 is a schematic diagram illustrating a semiconductor device according to example embodiments of the present disclosure. FIG. 9 is a diagram illustrating an operation of a semiconductor device according to example embodiments of the present disclosure.

Referring to FIG. 8, a semiconductor device 300 according to example embodiments may include a memory cell array 310, sub-word line decoders 320 and 330, and the like. The memory cell array 310 may include a plurality of memory cells MC. The memory cell array 310 may be connected to the sub-word line decoders 320 and 330 through a plurality of word lines WLn and WLn+1.

A structure of each of the sub-word line decoders 320 and 330 may be as described above with reference to FIG. 6. Referring to FIG. 8, each of the sub-word line decoders 320 and 330 may include first to third switch elements PM1, NM1, and NM2 and a floating element NM3. In the example embodiment illustrated in FIG. 8, a word line control signal NWEIB1 may be input in common into an n-th sub-word line decoder 320 and an n+1-th sub-word line decoder 330. Accordingly, as described above with reference to FIG. 7, the n-th sub-word line decoder 320 and the n+1-th sub-word line decoder 330 may be included in the same decoder group. For example, n may be a positive natural number. First driving signals PXID1 and PXID2 and second driving signals PXIB1 and PXIB2, input into the n-th sub-word line decoder 320 and the n+1-th sub-word line decoder 330, may be different from floating control signals FLOATB1 and FLOATB2.

An operation of the semiconductor device 300 according to the example embodiment illustrated in FIG. 8 will be described with reference to FIG. 9. In the example embodiment illustrated in FIG. 9, an n-th word line WLn may be determined as a selected word line, and an n+1-th word line WLn+1 may be determined as an unselected word line.

Referring to FIGS. 8 and 9, when the word line control signal NWEIB1 decreases from a high logic level H to a low logic level L, a first driving signal PXID1, input into the n-th sub-word line decoder 320, may increase from the low logic level L to the high logic level H. In the n-th sub-word line decoder 320, the first switch element PM1 may be turned on and the second switch element NM1 may be turned off, and the first driving signal PXID1 may be input into the n-th word line WLn. Accordingly, a voltage of the n-th word line WLn may increase from the initial level Vinit to the active level Vpwr.

Conversely, a second driving signal PXIB1, input into the n-th sub-word line decoder 320, may decrease from the high logic level H to the low logic level L, and the floating control signal FLOATB1 may be maintained at the high logic level H. Accordingly, in the n-th sub-word line decoder 320, the third switch element NM2 may be turned off, and the floating element NM3 may be maintained in an ON state.

Referring to FIGS. 8 and 9, when the word line control signal NWEIB1 decreases from the high logic level H to the low logic level L, a first driving signal PXID2, input into the n+1-th sub-word line decoder 330, may be maintained at the low logic level L. In addition, a second driving signal PXIB2 and a floating control signal FLOATB2, input into the n+1-th sub-word line decoder 330, may be maintained at the high logic level H. Accordingly, the reference voltage VSS may be input into the n+1-th word line WLn+1, and a voltage of the n+1-th word line WLn+1 may be maintained at an initial level corresponding to the reference voltage VSS.

When a control operation performed on at least one selected memory cell among the memory cells MC connected to the n-th word line WLn is completed, the voltage of the n-th word line WLn may decrease from the active level Vpwr to the initial level Vinit. In the example embodiment illustrated in FIG. 9, at a first time point t1, the word line control signal NWEIB1 and the second driving signal PXIB1 may transition to the high logic level H, and the first driving signal PXID1 may transition to the low logic level L. Accordingly, at the first time point t1, the reference voltage VSS may be input into the n-th word line WLn by the n-th sub-word line decoder 320, and the voltage of the n-th word line WLn may decrease from the active level Vpwr to the initial level Vinit.

Referring to FIGS. 8 and 9, in the n+1-th sub-word line decoder 330, the floating control signal FLOATB2 may transition to the low logic level L at the first time point t1. For example, a logic level of the floating control signal FLOATB2 may be set to the low logic level L during at least a portion of a precharging period in which a voltage of the n-th word line WLn decreases from the active level Vpwr to the initial level Vinit. For example, a voltage of the low logic level L may correspond to a voltage at the initial level (e.g., a reference voltage VSS). In other words, a voltage of the floating control signal FLOATB2 may be set to the initial level Vinit during at least a portion of a precharging period in which a voltage of the n-th word line WLn decreases from the active level Vpwr to the initial level Vinit. Accordingly, the floating element NM3 of the n+1-th sub-word line decoder 330 may be turned off, and the n+1-th word line WLn+1 may float. For example, a second time period ΔT2 in which the n+1-th word line WLn+1 floats may be longer than a first time period ΔT1 in which the voltage of the n-th word line WLn decreases to the initial level Vinit. For example, the first time period ΔT1 may correspond to a precharging period in which a voltage of the n-th word line WLn decreases from the active level Vpwr to the initial level Vinit.

As the floating element NM3 is turned off at the first time point t1, the voltage of the n+1-th word line WLn+1 may decrease to a floating level Vft lower than the initial level Vinit. This may be because the voltage of the n-th word line WLn, adjacent to the n+1-th word line WLn+1, decreases from the active level Vpwr to the initial level Vinit. For example, the voltage of the n+1-th word line WLn+1 may be set to a floating level Vft that is lower than the initial level Vinit during at least a portion of a period in which the voltage of the n-th word line WLn decreases from the active level Vpwr to the initial level Vinit. For example, a second voltage difference ΔV2 between the initial level Vinit and the floating level Vft may be less than a first voltage difference ΔV1 between the active level Vpwr and the initial level Vinit. For example, a voltage variation range (e.g., ΔV1) of the n-th word line WLn (e.g., the selected word line) may be greater than a voltage variation range (e.g., ΔV2) of the n+1-th word line WLn+1 (e.g., the unselected word line).

In example embodiments, the floating control signal FLOATB2, input into the n+1-th sub-word line decoder 330, may transition back to the high logic level H after the second time period ΔT2 elapses, such that the floating element NM3 may be turned on, and the voltage of the n+1-th word line WLn+1 may increase to the initial level Vinit. During at least portion of the first time period ΔT1 in which the voltage of the n-th word line WLn decreases, the voltage of the adjacent n+1-th word line WLn+1 may be reduced to the floating level Vft lower than the initial level Vinit, thereby preventing charges discharged from a channel region adjacent to a gate structure providing the n-th word line WLn from flowing into memory cells connected to the n+1-th word line WLn+1. Accordingly, loss and/or change of data of unselected memory cells connected to an unselected word line, adjacent to a selected word line, may be minimized.

Figure 10:
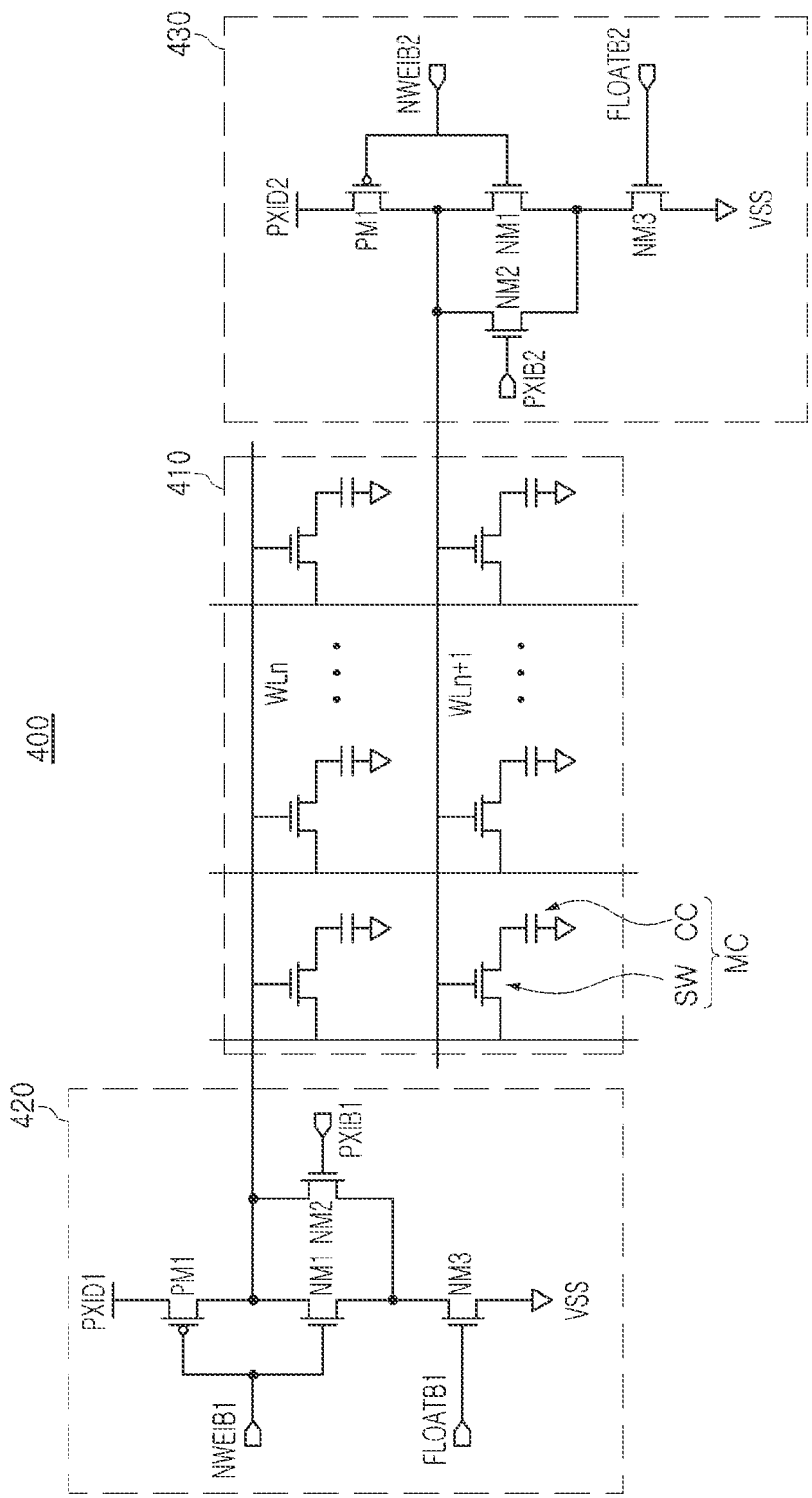
FIG. 10 is a schematic diagram illustrating a semiconductor device according to example embodiments of the present disclosure.
Figure 11:
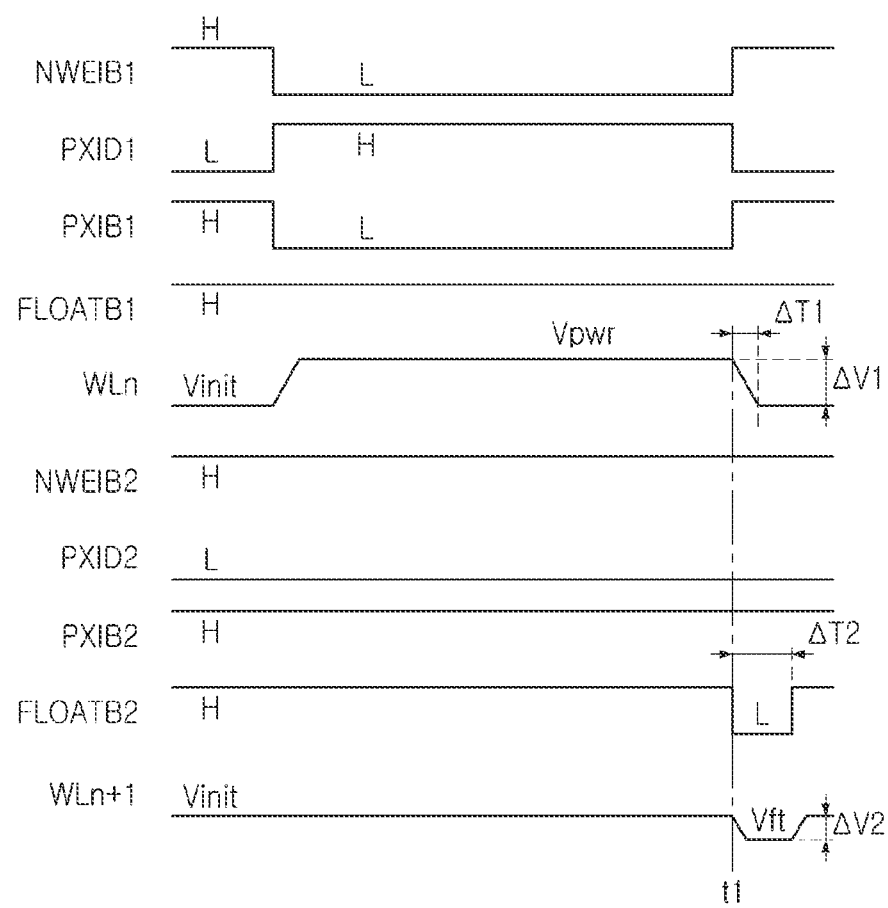
FIGS. 11 to 13 are diagrams illustrating an operation of a semiconductor device according to example embodiments of the present disclosure.
Figure 12:
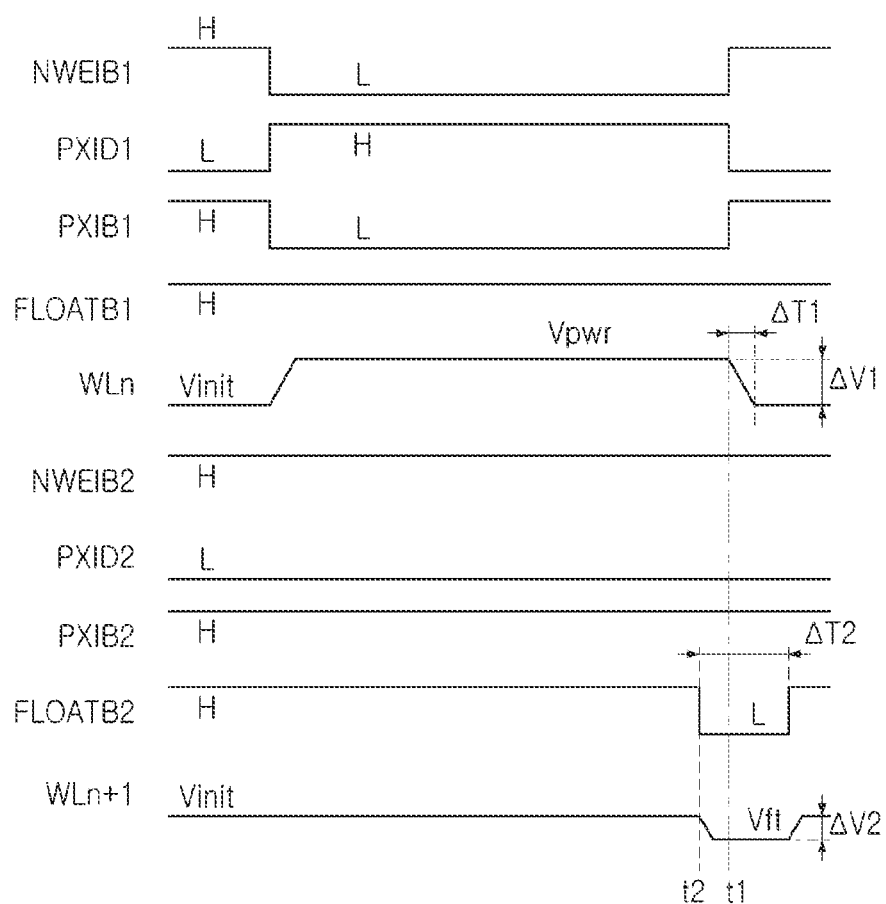
Figure 13:
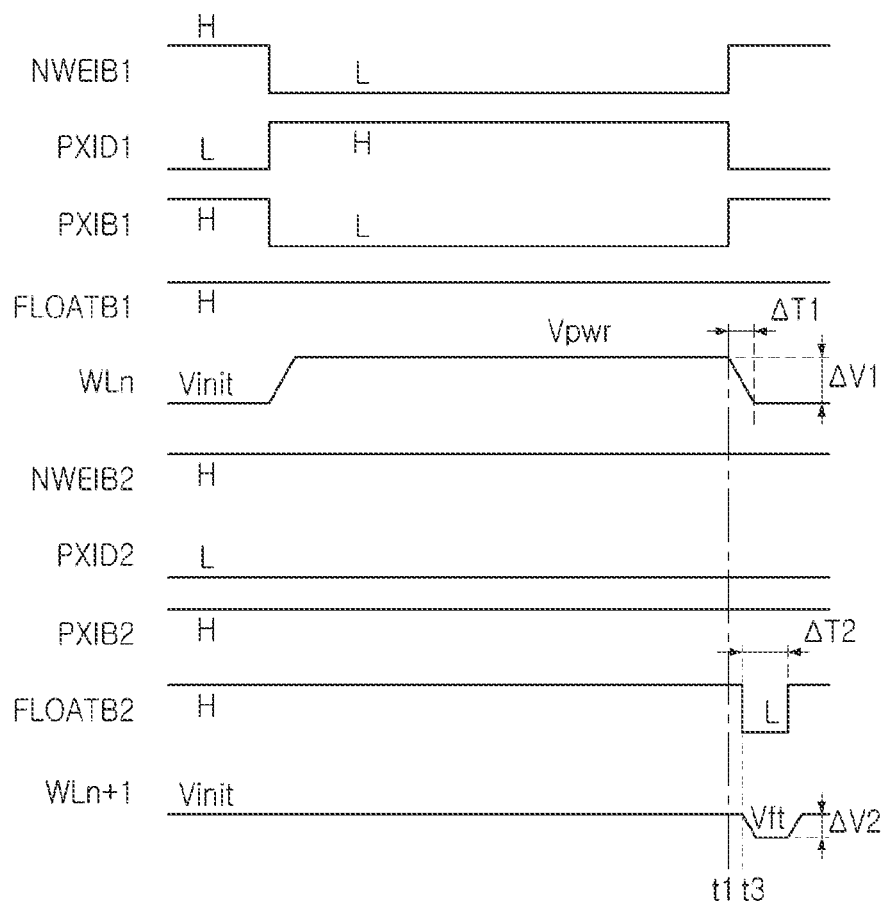

FIG. 10 is a schematic diagram illustrating a semiconductor device according to example embodiments of the present disclosure. FIGS. 11 to 13 are diagrams illustrating an operation of a semiconductor device according to example embodiments of the present disclosure.

Referring to FIG. 10, a semiconductor device 400 according to example embodiments of the present disclosure may include a memory cell array 410, sub-word line decoders 420 and 430, and the like. The memory cell array 410 may include a plurality of memory cells MC. The memory cell array 410 may be connected to the sub-word line decoders 420 and 430 through a plurality of word lines WLn and WLn+1.

Each of the sub-word line decoders 420 and 430 may include first to third switch elements PM1, NM1, and NM2, and a floating element NM3. In the example embodiment illustrated in FIG. 10, a first word line control signal NWEIB1 may be input into an n-th sub-word line decoder 420, and a second word line control signal NWEIB2 may be input into an n+1-th sub-word line decoder 430. Accordingly, as described above with reference to FIG. 7, the n-th sub-word line decoder 420 and the n+1-th sub-word line decoder 430 may be grouped into different decoder groups. First driving signals PXID1 and PXID2 and second driving signals PXIB1 and PXIB2, input into the n-th sub-word line decoder 420 and the n+1-th sub-word line decoder 430, may be different from floating control signals FLOATB1 and FLOATB2.

An operation of the semiconductor device 400 according to the example embodiment illustrated in FIG. 10 will be described with reference to FIGS. 11 to 13. In each of the example embodiments illustrated in FIGS. 11 to 13, the n-th word line WLn may be determined as a selected word line, and the n+1-th word line WLn+1 may be determined as an unselected word line.

First, an operation according to the example embodiment illustrated in FIG. 11 may be similar to that described above with reference to FIG. 9. The first driving signal PXID1, input into the n-th sub-word line decoder 420, may transition to the high logic level H, and the second driving signal PXIB1 and the word line control signal NWEIB1 may transition to the low logic level L, such that a voltage of the n-th word line WLn may increase from the initial level Vinit to the active level Vpwr. Conversely, the first driving signal PXID2, input into the n+1-th sub-word line decoder 430, may be maintained at the low logic level L, and the word line control signal NWEIB2 and the second driving signal PXIB2 may be maintained at the high logic level H. Accordingly, a voltage of the n+1-th word line WLn+1 may be maintained at the initial level Vinit.

The voltage of the n-th word line WLn may decrease from the active level Vpwr to the initial level Vinit during the first time period ΔT1 starting from the first time point t1. Referring to FIGS. 10 and 11, the floating control signal FLOATB2, input into the n+1-th sub-word line decoder 430, may transition to the low logic level L at the first time point t1, such that the floating element NM3 may be turned off, and the n+1-th word line WLn+1 may float from the first time point t1. For example, a voltage of the floating control signal FLOATB2 may be set to the initial level Vinit during at least a portion of a precharging period in which a voltage of the n-th word line WLn decreases from the active level Vpwr to the initial level Vinit. Accordingly, the voltage of the n+1-th word line WLn+1 may decrease to the floating level Vft lower than the initial level Vinit under the influence of a decrease in the voltage of the adjacent n-th word line WLn.

As described above, the floating control signal FLOATB2 may turn off the floating element NM3 during the second time period ΔT2. In addition, the second voltage difference ΔV2 between the initial level Vinit and the floating level Vft may be less than the first voltage difference ΔV1 between the initial level Vinit and the active level Vpwr.

In the example embodiment illustrated in FIG. 12, the n+1-th word line WLn+1 may float at a second time point t2 earlier than the first time point t1. In other words, while the voltage of the n-th word line WLn is maintained at the active level Vpwr, the n+1-th word line WLn+1 may float first. For example, the n+1-th word line WLn+1 may be floated during at least a portion of a period in which the voltage of the n-th word line WLn is maintained at the active level Vpwr. Referring to FIG. 12, the second time period ΔT2 in which the n+1-th word line WLn+1 is caused to float by the floating control signal FLOATB2 may start earlier than the first time period ΔT1 in which the voltage of the n-th word line WLn decreases from the active level Vpwr to the initial level Vinit, and may end later than the first time period ΔT1.

In the example embodiment illustrated in FIG. 13, the n+1-th word line WLn+1 may float at a third time point t3 later than the first time point t1. The third time point t3 may belong to the first time period ΔT1 in which the voltage of the n-th word line WLn decreases from the active level Vpwr to the initial level Vinit. In other words, while the voltage of the n-th word line WLn decreases from the active level Vpwr to the initial level Vinit, the floating element NM3 of the n+1-th sub-word line decoder 430 may be turned off. For example, the voltage of the n-th word line WLn may begin to decrease from the active level Vpwr to the initial level Vinit before the floating element NM3 of the n+1-th sub-word line decoder 430 is turned off, but may not decrease entirely from the active level Vpwr to the initial level Vinit before the floating element NM3 of the n+1-th sub-word line decoder 430 is turned off. For example, a logic level of the floating control signal FLOATB2 may be set to the high logic level H during at least a portion of a precharging period in which a voltage of the n-th word line WLn decreases from the active level Vpwr to the initial level Vinit. For example, a voltage of the high logic level H may correspond to a voltage that is higher than the initial level Vinit. In other words, a voltage of the floating control signal FLOATB2 may be set to a voltage higher than the initial level Vinit during at least a portion of a precharging period in which a voltage of the n-th word line WLn decreases from the active level Vpwr to the initial level Vinit. Accordingly, as illustrated in FIG. 13, a portion of the first time period ΔT1 may overlap the second time period ΔT2.

Figure 14:
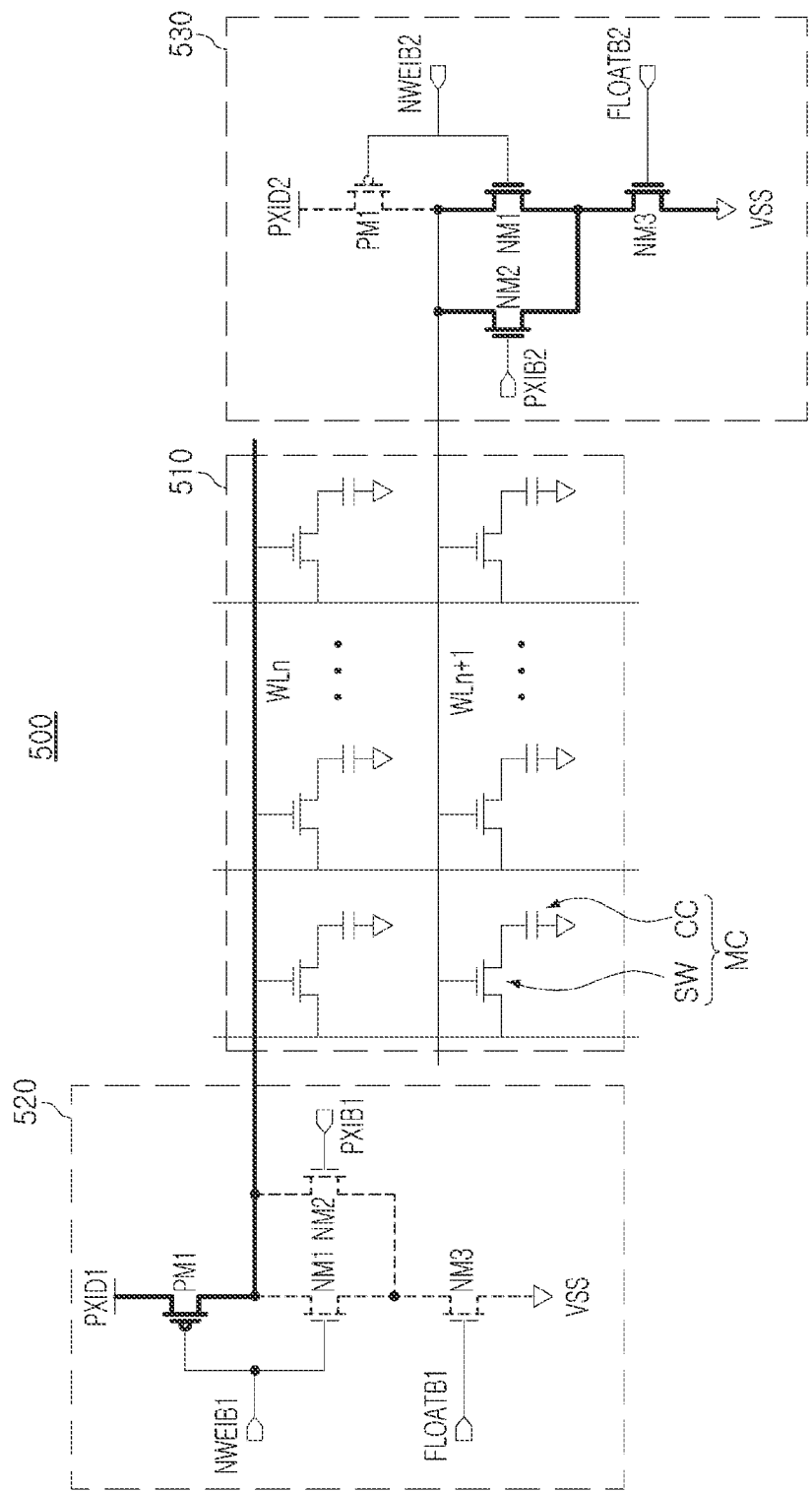
FIGS. 14 to 16 are diagrams illustrating an operation of a semiconductor device according to example embodiments of the present disclosure.
Figure 15:
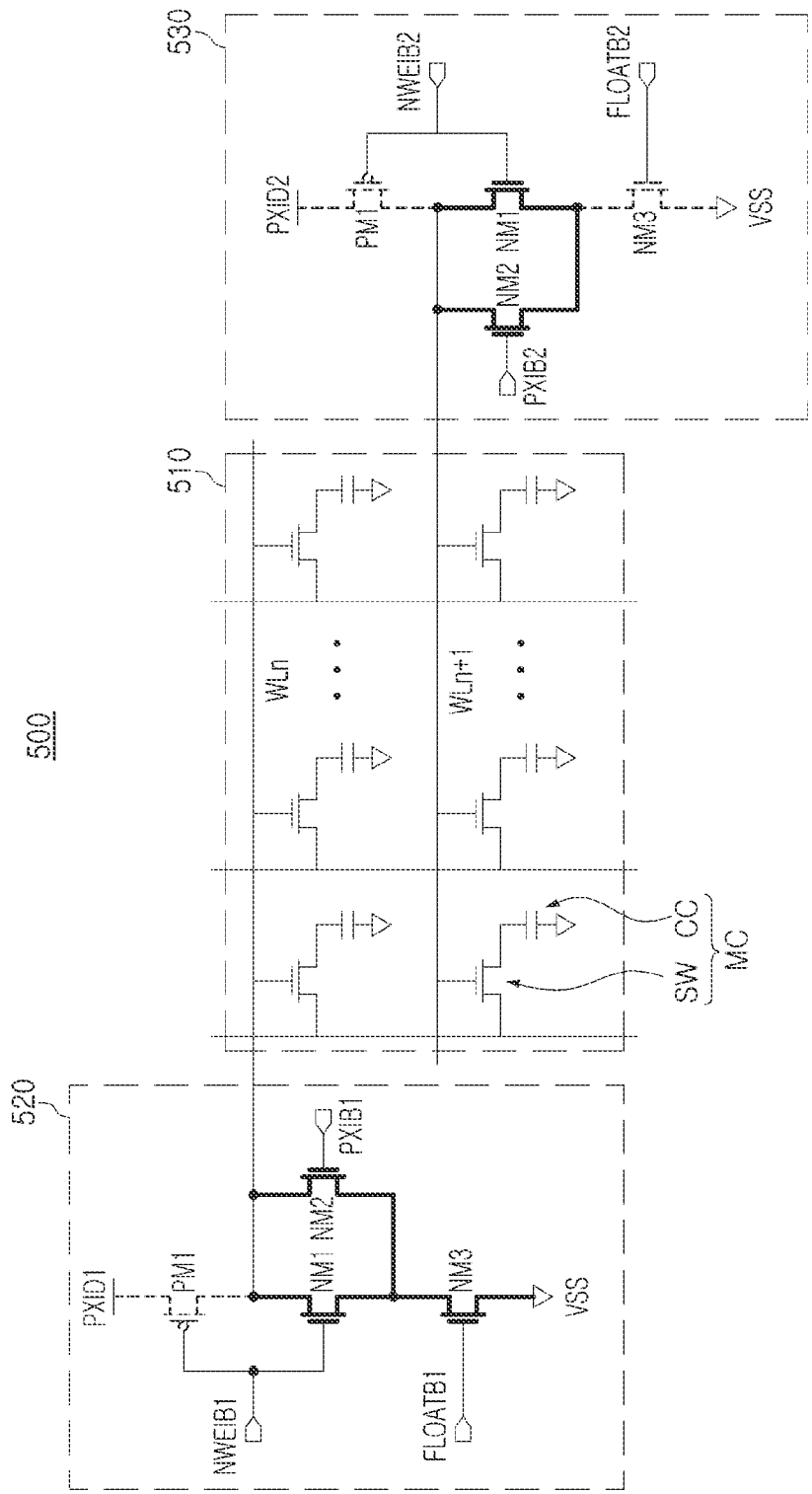
Figure 16:
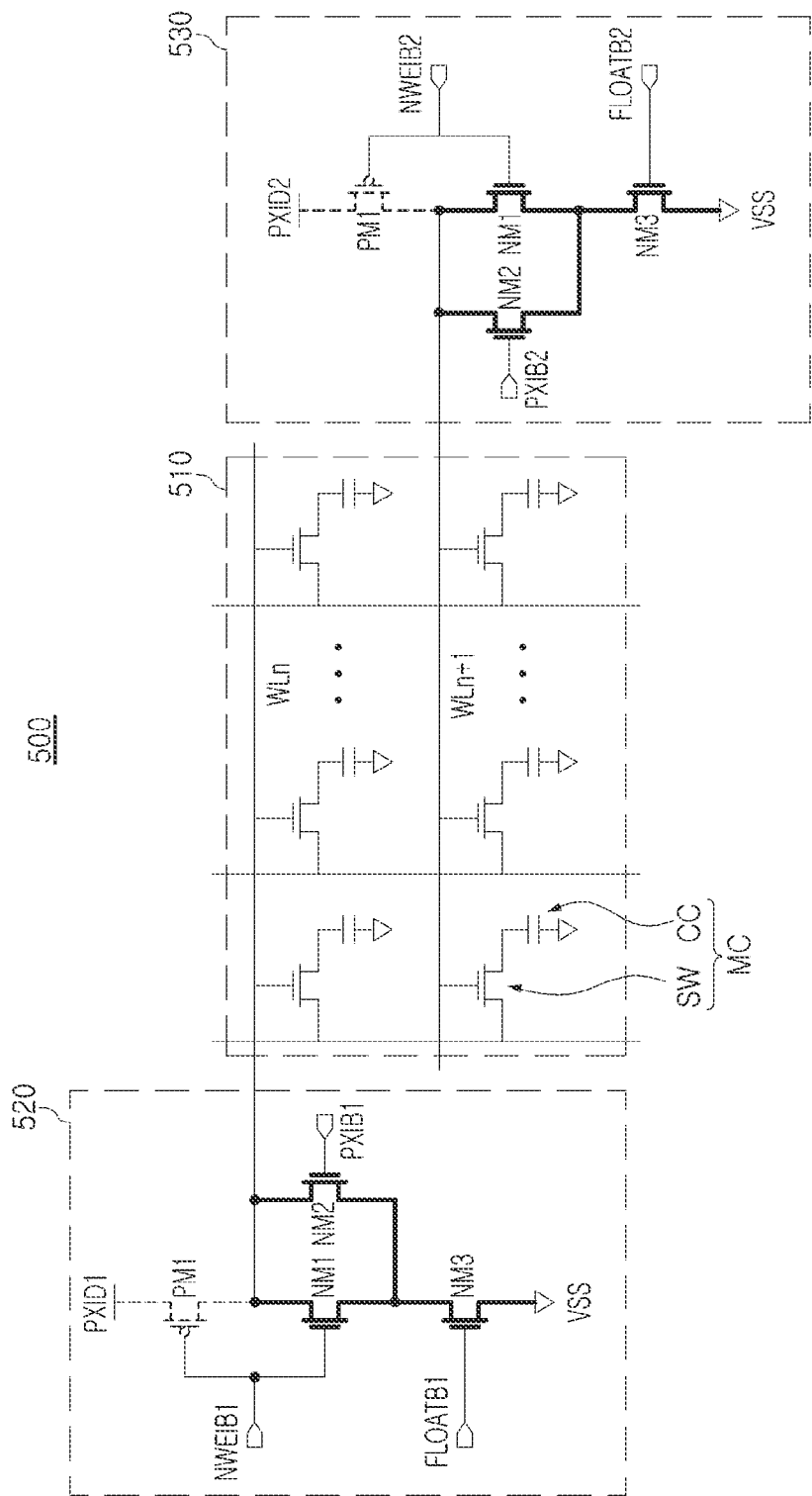

FIGS. 14 to 16 are diagrams illustrating an operation of a semiconductor device according to example embodiments of the present disclosure.

In example embodiments described with reference to FIGS. 14 to 16, a control logic of a semiconductor device 500 may select the n-th word line WLn as a selected word line, and select the n+1-th word line WLn+1 as an unselected word line in a memory cell array 510. Referring first to FIG. 14, in an n-th sub-word line decoder 520 connected to the selected word line, the first switch element PM1 may be turned on, and the second switch element NM1 and the third switch element NM2 may be turned off.

The floating element NM3 can be turned on by the floating control signal FLOATB1. However, since the second switch element NM1 and the third switch element NM2 are turned off, a voltage of the n-th word line WLn may be determined depending on the first driving signal PXID1 rather than the reference voltage VSS. The control logic of the semiconductor device 500 may increase a level of the first driving signal PXID1, thereby increasing the voltage of the n-th word line WLn to an active level, and turning on the cell switch SW of each of the memory cells MC connected to the n-th word line WLn.

In an n+1-th sub-word line decoder 530 connected to the unselected word line, the first switch element PM1 may be turned off, the second switch element NM1, the third switch element NM2, and the floating element NM3 may be turned on. Accordingly, the reference voltage VSS may be input into the n+1-th word line WLn+1 by the n+1-th sub-word line decoder 530, and the cell switch SW of each of the memory cells MC connected to the n+1-th word line WLn+1 may be maintained in an OFF state.

The control logic of the semiconductor device 500 may perform a control operation on at least one of the memory cells MC connected to the n-th word line WLn using bit line sense amplifiers. When the control operation is completed, the control logic may decrease the voltage of the n-th word line WLn. Referring to FIG. 15, in the n-th sub-word line decoder 520, the first switch element PM1 may be turned off, and the second switch element NM1 and the third switch element NM2 may be turned on. Accordingly, the reference voltage VSS may be input into the n-th word line WLn, and the voltage of the n-th word line WLn may be initialized to an initial level.

The control logic may cause the n+1-th word line WLn+1, an unselected word line adjacent to the n-th word line WLn, to float while the voltage of the n-th word line WLn decreases to the initial level. Referring to FIG. 15, in the n+1-th sub-word line decoder 530, the floating element NM3 may be turned off by the floating control signal FLOATB2, and accordingly neither the reference voltage VSS nor the first driving signal PXID2 may be input into the n+1-th word line WLn+1.

In a floating state, a voltage of the n+1-th word line WLn+1 may decrease to a level lower than the initial level under the influence of a decrease in the voltage of the adjacent n-th word line WLn. Accordingly, the cell switch SW of each of the memory cells MC connected to the n+1-th word line WLn+1 may be turned off more strongly than the state described with reference to FIG. 14, the cell switches SW connected to the n-th word line WLn may be turned off, and charges discharged from a channel region may not flow into the cell capacitors CC of the memory cells MC connected to the n+1-th word line WLn+1, thereby preventing change and/or loss of data of the memory cells MC connected to the unselected word line, and improving reliability of the semiconductor device 500.

Subsequently, referring to FIG. 16, in the n+1-th sub-word line decoder 530, the floating element NM3 may be turned on by the floating control signal FLOATB2 after a predetermined time period elapses. Accordingly, the n+1-th word line WLn+1 may be connected to the reference node, and the voltage of the n+1-th word line WLn+1 may return to the initial level.

In some example embodiments of the present disclosure, during at least a portion of a precharging period in which a voltage of a selected word line returns from an active level to an initial level, an unselected word line, adjacent to the selected word line, may not completely float. For example, in a sub-word line decoder connected to the unselected word line, a floating element may not be completely turned off. A voltage between a turn-on voltage and a turn-off voltage may be input into the floating element, and thus the floating element may operate as a type of resistance element.

The floating element may be connected between a reference node supplying a reference voltage and some of a plurality of switch elements. Accordingly, while the floating element operates as a resistive element, it can be seen that an equivalent circuit in which the unselected word line is connected to the reference node through the resistance element is formed, and charges of the unselected word line may be removed through the floating element. Hereinafter, such a configuration will be described in more detail with reference to FIGS. 17 and 18.

Figure 17:
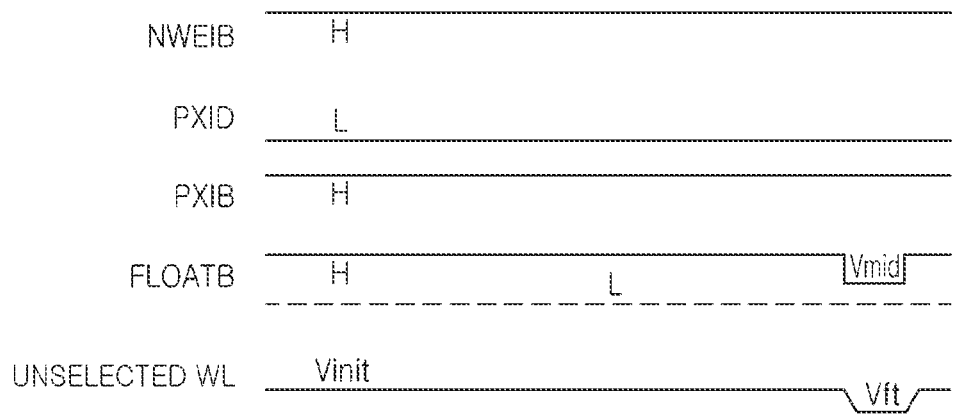
FIGS. 17 and 18 are diagrams illustrating an operation of a semiconductor device according to example embodiments of the present disclosure.
Figure 18:
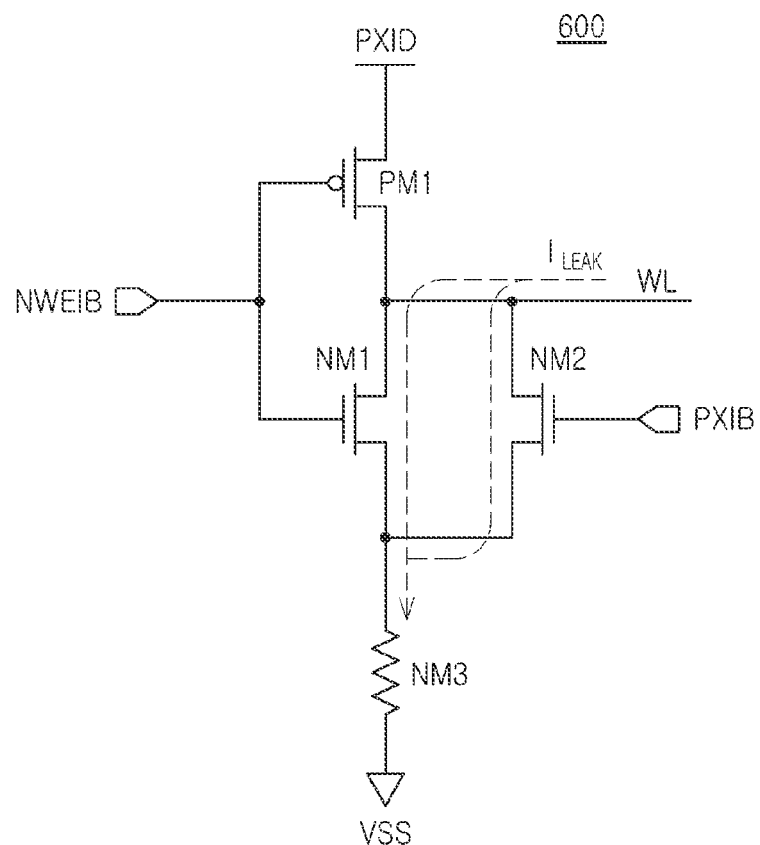

FIGS. 17 and 18 are diagrams illustrating an operation of a semiconductor device according to example embodiments of the present disclosure.

In example embodiments described with reference to FIGS. 17 and 18, an intermediate voltage Vmid between a turn-on voltage and a turn-off voltage may be input into the floating element NM3 of a sub-word line decoder 600 to which the word line WL is connected. When another word line, adjacent to the word line WL, is selected, the intermediate voltage Vmid may be input into the floating element NM3 during at least a portion of a precharging period in which a voltage of the other word line returns from an active level to an initial level.

Referring to FIGS. 17 and 18, in a period overlapping at least a portion of the precharging period in which the voltage of the selected word line decreases to the initial level, the intermediate voltage Vmid may be input into the floating element NM3 of the sub-word line decoder 600. The floating element NM3 may be an NMOS transistor. The intermediate voltage Vmid may have a level higher than the low logic level L corresponding to a turn-off voltage of the floating element NM3, and lower than the high logic level H corresponding to a turn-on voltage of the floating element NM3.

As illustrated in FIG. 18, the floating element NM3 may operate as a type of resistance element. By the word line control signal NWEIB, the first switch element PM1 may be turned off and the second switch element NM1 may be turned on. The third switch element NM2 may be turned on by the second driving signal PXIB. Accordingly, the word line WL may be connected to the floating element NM3 operating as a resistance element.

Accordingly, the word line WL may be connected to a reference node supplying the reference voltage VSS through the sub-word line decoder 600 (e.g., through the floating element NM3), and a charge leakage path through which the leakage current $I_{LEAK}$ flows may be formed between the word line WL and the reference node. While a voltage of another word line, adjacent to the word line WL, decreases from the active level to the initial level, charges may be discharged from a channel region of cell switches connected to the another word line, and a parasitic capacitance component between the word line WL and the another adjacent word line may be charged due to the discharged charges.

In example embodiments of the present disclosure, if necessary, as illustrated in FIGS. 17 and 18, a path through which the leakage current $I_{LEAK}$ flows may be generated by weakly turning on the floating element NM3. Accordingly, when parasitic capacitance between word lines is charged due to charges discharged during a turn-off operation of cell switches connected to a selected word line, the parasitic capacitance may be removed using the leakage current LEAK. For example, when a specific word line is repeatedly selected as the selected word line and accesses to the word line are accumulated, a control logic of a semiconductor device may control the sub-word line decoder 600 connected to another adjacent word line, as described with reference to FIGS. 17 and 18, thereby removing the parasitic capacitance between the word lines.

As used herein, the terms "comprises", "comprising", "includes", "including", "has", "having" and any other variations thereof specify the presence of the stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

While example embodiments have been shown and described above, it will be apparent to those skilled in the art that modifications and variations could be made without departing from the scope of the present disclosure as defined by the appended claims.

What is claimed is:

1. A semiconductor device comprising:
   a memory cell array that includes a plurality of memory cells electrically connected to a plurality of word lines and a plurality of bit lines;
   a word line driving circuit that includes a plurality of sub-word line decoders electrically connected to the plurality of word lines; and
   a control logic configured to determine a selected word line and unselected word lines among the plurality of word lines, and configured to control the word line driving circuit such that at least one of the unselected word lines that is adjacent to the selected word line is floated during at least a portion of a period in which a voltage of the selected word line returns to an initial level.

2. The semiconductor device of claim 1, further comprising a sense amplifier circuit that includes a plurality of sense amplifiers electrically connected to the plurality of bit lines, wherein the control logic is further configured to control the word line driving circuit such that the voltage of the selected word line increases from the initial level to an active level, and then returns to the initial level.

3. The semiconductor device of claim 2, wherein the active level is higher than the initial level.

4. The semiconductor device of claim 2, wherein the control logic is further configured to control the word line driving circuit such that a voltage of the at least one of the unselected word lines is set to the initial level during a period in which the voltage of the selected word line increases from the initial level to the active level and during a period in which the voltage of the selected word line is maintained at the active level.

5. The semiconductor device of claim 2, wherein the control logic is further configured to control the word line driving circuit such that the at least one of the unselected word lines is floated during at least a portion of a period in which the voltage of the selected word line is maintained at the active level.

6. The semiconductor device of claim 2, wherein the control logic is further configured to control the word line driving circuit such that the at least one of the unselected word lines is floated during at least a portion of a period in which the voltage of the selected word line returns from the active level to the initial level.

7. The semiconductor device of claim 1, wherein the control logic is further configured to set respective voltages of remaining ones of the unselected word lines other than the at least one of the unselected word lines to the initial level.

8. The semiconductor device of claim 1, wherein the control logic is further configured to control the word line driving circuit such that the at least one of the unselected word lines is floated until a predetermined time period elapses after the voltage of the selected word line returns to the initial level.

9. The semiconductor device of claim 1, wherein a voltage variation range of the selected word line is greater than a voltage variation range of the at least one of the unselected word lines.

10. The semiconductor device of claim 1, wherein a voltage of the at least one of the unselected word lines decreases to a level lower than the initial level during at least a portion of the period in which the voltage of the selected word line returns to the initial level.

11. A semiconductor device comprising:
a memory cell array that includes a plurality of memory cells electrically connected to a plurality of word lines and a plurality of bit lines;
a word line driving circuit that includes a plurality of sub-word line decoders electrically connected to the plurality of word lines; and
a control logic configured to determine a selected word line and unselected word lines among the plurality of word lines,
wherein each of the plurality of sub-word line decoders includes a plurality of switch elements electrically connected to a respective one of the plurality of word lines, and a floating element electrically connected between a reference node supplying a voltage at an initial level and at least a portion of the plurality of switch elements, and
wherein, during at least a portion of a precharging period in which a voltage of the selected word line decreases from an active level to the initial level, the control logic is configured to input a floating control signal having a voltage that turns off the floating element into the floating element.

12. The semiconductor device of claim 11, wherein the floating element is an NMOS transistor, and
wherein the control logic is further configured to input the voltage at the initial level into the floating element during at least a portion of the precharging period.

13. The semiconductor device of claim 11, wherein the plurality of switch elements include a first switch element electrically connected between a driving node supplying a driving signal and the respective one of the plurality of word lines, and a second switch element and a third switch element electrically connected to each other in parallel between the respective one of the plurality of word lines and the floating element.

14. The semiconductor device of claim 13, wherein the first switch element is a PMOS transistor, and
wherein each of the second switch element and the third switch element is an NMOS transistor.

15. The semiconductor device of claim 13, wherein the control logic is further configured to:
input a first control signal into the first switch element and the second switch element, and
input a second control signal into the third switch element.

16. The semiconductor device of claim 15, wherein the floating control signal is different from the first control signal and the second control signal.

17. The semiconductor device of claim 11, wherein the control logic is further configured to set the voltage of the floating control signal to the initial level during at least a portion of the precharging period.

18. The semiconductor device of claim 11, wherein the control logic is further configured to set the voltage of the floating control signal to a voltage higher than the initial level during at least a portion of the precharging period.

19. A semiconductor device comprising:
a memory cell array that includes a plurality of memory cells electrically connected to a plurality of word lines and a plurality of bit lines; and
a peripheral circuit configured to control the memory cell array,
wherein the peripheral circuit is configured to:
perform a control operation for a selected memory cell among the plurality of memory cells through a selected bit line among the plurality of bit lines while a voltage of a selected word line among the plurality of word lines is maintained at an active level, and
set a voltage of at least one unselected word line, adjacent to the selected word line, among the plurality of word lines to a level lower than an initial level during at least a portion of a period in which the voltage of the selected word line decreases from the active level to the initial level.

20. The semiconductor device of claim 19, wherein the voltage of the at least one unselected word line decreases from the initial level to a floating level that is lower than the initial level during at least the portion of the period in which the voltage of the selected word line decreases from the active level to the initial level,
wherein a voltage difference between the initial level and the floating level is less than a voltage difference between the initial level and the active level, and
wherein the peripheral circuit is further configured to set the voltage of the at least one unselected word line to the floating level by floating the at least one unselected word line.

* * * * *